United States Patent
Inaba et al.

(10) Patent No.: US 10,615,300 B2
(45) Date of Patent: Apr. 7, 2020

(54) METHOD FOR MANUFACTURING SOLAR PANEL

(71) Applicants: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

(72) Inventors: Hirotaka Inaba, Kariya (JP); Kazumasa Okumura, Kariya (JP); Koki Ikeda, Toyota (JP); Motoya Sakabe, Nisshin (JP); Kazuyoshi Ogata, Toyota (JP)

(73) Assignees: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

(*) Notice: Subject to any disclaimer, the term of this patent is extended or adjusted under 35 U.S.C. 154(b) by 0 days.

(21) Appl. No.: 16/215,860

(22) Filed: Dec. 11, 2018

(65) Prior Publication Data
US 2019/0181283 A1   Jun. 13, 2019

(30) Foreign Application Priority Data
Dec. 13, 2017  (JP) .................................. 2017-238668

(51) Int. Cl.
*H01L 31/048* (2014.01)
*H01L 31/18* (2006.01)
(Continued)

(52) U.S. Cl.
CPC ........ *H01L 31/048* (2013.01); *B32B 37/1027* (2013.01); *H01L 31/03926* (2013.01);
(Continued)

(58) Field of Classification Search
CPC ............... H01L 31/048; H01L 31/0488; H01L 31/0481; H01L 31/049; H01L 31/0504;
(Continued)

(56) References Cited

U.S. PATENT DOCUMENTS 6,367,530 B1 *  4/2002  Shimotomai ........... B29C 43/56
                                                       156/382
8,790,951 B2 *  7/2014  Safir .................... B32B 37/1018
                                                       136/256
(Continued)

FOREIGN PATENT DOCUMENTS

DE   10 2010 061 294 A1   6/2012
JP          2010-149506 A  7/2010

*Primary Examiner* — Michael M Trinh
(74) *Attorney, Agent, or Firm* — Sughrue Mion, PLLC

(57) ABSTRACT

A method for manufacturing a solar panel includes preparing a laminated body including a plastic protection cover that is light-transmissive and is curved in a convex manner, a flat plastic back cover, a photovoltaic battery cell, and an encapsulant that holds the photovoltaic battery cell in an encapsulated state, mounting the laminated body on a laminating jig such that the back cover abuts the laminating jig, and heating the laminated body with the laminating jig and compression-bonding the laminated body by holding the laminated body between a diaphragm and the laminating jig, thereby obtaining a solar panel from the laminated body. The laminating jig is curved in a convex manner toward the laminated body.

4 Claims, 7 Drawing Sheets

(51) Int. Cl.
*H02S 30/10* (2014.01)
*B32B 37/10* (2006.01)
*H01L 31/049* (2014.01)
*H01L 31/053* (2014.01)
*H01L 31/0392* (2006.01)
*H01L 31/05* (2014.01)
*B29C 43/56* (2006.01)
*H02S 10/40* (2014.01)
*B60R 16/03* (2006.01)

(52) U.S. Cl.
CPC ........ *H01L 31/049* (2014.12); *H01L 31/0488* (2013.01); *H01L 31/053* (2014.12); *H01L 31/0504* (2013.01); *H01L 31/1876* (2013.01); *H02S 30/10* (2014.12); *B29C 2043/561* (2013.01); *B60R 16/03* (2013.01); *B60Y 2400/216* (2013.01); *H02S 10/40* (2014.12)

(58) Field of Classification Search
CPC ............. H01L 31/032926; H01L 31/18; H01L 31/1876; H01L 31/188; H01L 31/053; B32B 37/1018; B32B 37/10; B32B 37/1027; B32B 37/1036; B29C 43/56; B29C 2043/181; B29C 2043/561; H02S 30/10; H02S 10/40; B60Y 2400/216; B60R 16/03
See application file for complete search history.

(56) References Cited

U.S. PATENT DOCUMENTS

| | | | |
|---|---|---|---|
| 2011/0083717 A1* | 4/2011 | Nishi ................. | B32B 37/1018 136/244 |
| 2014/0106497 A1* | 4/2014 | Nakatani ............. | H01L 31/048 438/67 |
| 2015/0129013 A1* | 5/2015 | Nositschka ....... | B32B 17/10018 136/245 |
| 2018/0358493 A1* | 12/2018 | Iwamoto ............. | H01L 31/049 |

* cited by examiner

METHOD FOR MANUFACTURING SOLAR PANEL

BACKGROUND

The present disclosure relates to a method for manufacturing a solar panel.

Japanese Laid-Open Patent Publication No. 2010-149506 discloses a conventional method for manufacturing a solar panel (hereinafter simply referred to as the conventional manufacturing method). The conventional manufacturing method includes a preparation step, a mounting step, and a laminating step. The conventional manufacturing method involves the use of a laminating device that includes a diaphragm, a laminating jig, and a heater. The diaphragm is opposed to the laminating jig. The heater is capable of heating the laminating jig.

In the conventional manufacturing method, the preparation step is performed first. The preparation step involves the preparation of a laminated body that includes a protection cover, a back cover, photovoltaic battery cells, and an encapsulant. The protection cover is light-transmissive from its front surface to its rear surface and is curved in a convex manner from the rear surface toward the front surface. The back cover is a flat plate. The above-described document does not explicitly describe the materials of the protection cover and the back cover. The protection cover is generally made of glass but may recently be made of plastic from the perspective of weight reduction. The back cover is generally made of plastic.

The photovoltaic battery cells are arranged in a matrix manner. The encapsulant includes two encapsulant sheets, namely, a first encapsulant sheet and a second encapsulant sheet. The laminated body is formed by laminating the protection cover, the first encapsulant sheet, the photovoltaic battery cells, the second encapsulant sheet, and the back cover in this order.

Then, the mounting step is performed. In the mounting step, the laminated body is mounted on the laminating jig with the protection cover, more specifically, the front surface of the protection cover abutting the laminating jig. The laminating jig is curved so that its middle part is recessed in conformance with the shape of the protection cover. Thus, mounting the laminated body on the laminating jig causes the front surface of the protection cover to abut the laminating jig.

Subsequently, the laminating step is performed. In the laminating step, the laminating jig heated by the heater is pressed on the protection cover to heat the laminated body. This softens the back cover and the two encapsulant sheets. In this state, the laminated body is held between the diaphragm and the laminating jig to compression-bond the laminated body. This causes the back cover to be pressed by the diaphragm and curved in a convex manner toward the protection cover to have a product shape. In addition, the two softened encapsulant sheets are integrated so that the encapsulant holds the photovoltaic battery cells in an encapsulated state between the protection cover and the back cover. This integrates the protection cover, the back cover, the photovoltaic battery cells, and the encapsulant. In this manner, the solar panel is manufactured. In the solar panel, the front surface of the protection cover serves as a design surface.

In the above-described conventional manufacturing method, curving the back cover from a flat shape into the product shape in a preferred manner requires the back cover to be heated to a glass transition temperature and sufficiently softened. However, in the conventional manufacturing method, since the front surface of the protection cover abuts the laminating jig, the back cover is located at the farthest position from the laminating jig in the laminated body. Accordingly, heating the back cover to the glass transition temperature would require the laminating jig to be correspondingly heated to a high temperature and pressed on the protection cover. If the protection cover is made of plastic, heating the back cover to a high temperature by the laminating jig causes the protection cover to reach the glass transition temperature. This unnecessarily softens the protection cover and easily roughens its front surface, thereby deteriorating the aesthetic appeal of the manufactured solar panel.

Heating the laminated body to prevent the plastic protection cover from reaching the glass transition temperature prevents the back cover from reaching the glass transition temperature and being sufficiently softened. Thus, the back cover is not curved in a preferred manner. This causes, for example, the back cover to be creased and air to be trapped between the back cover and the encapsulant. Accordingly, the conventional manufacturing method makes it difficult to manufacture a high-quality solar panel including a plastic protection cover and a plastic back cover.

SUMMARY

It is an object of the present disclosure to provide a method for manufacturing a high-quality solar panel including a plastic protection cover and a plastic back cover.

A method for manufacturing a solar panel that solves the above problem includes preparing a laminated body including a plastic protection cover that is light-transmissive from a front surface to a rear surface and is curved in a convex manner from the rear surface toward the front surface, a flat plastic back cover arranged to face the rear surface of the protection cover, a photovoltaic battery cell, and an encapsulant that holds the photovoltaic battery cell in an encapsulated state between the protection cover and the back cover, mounting the laminated body on a laminating jig such that the back cover abuts the laminating jig, and heating the laminated body with the laminating jig until a temperature of the back cover reaches or exceeds a glass transition temperature and compression-bonding the laminated body by holding the laminated body between a diaphragm and the laminating jig, thereby obtaining a solar panel from the laminated body. The laminating jig is curved in a convex manner toward the laminated body.

Other features, aspects, and advantages will become apparent from the following description, taken in conjunction with the accompanying drawings, and the claims.

DETAILED DESCRIPTION

A first embodiment and a second embodiment of the present invention will now be described with reference to the drawings.

First Embodiment

Figure 1:
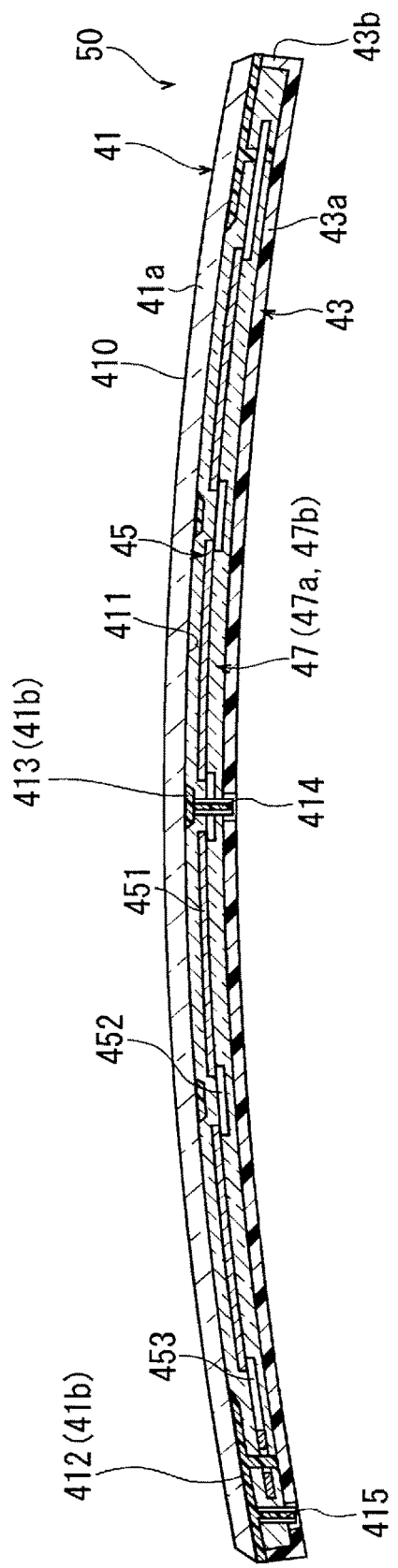
FIG. 1 is a cross-sectional view showing a solar panel manufactured through a manufacturing method according to a first embodiment.

As shown in FIG. 1, a vehicle solar panel 50 includes a protection cover 41, a back cover 43, a photovoltaic string 45, and an encapsulant 47. The vehicle solar panel 50 is an example of a solar panel in the present invention. The vehicle solar panel 50 is used for a vehicle (not shown) and attached to its roof panel. The protection cover 41, the back cover 43, the photovoltaic string 45, and the encapsulant 47 will be described in detail below.

In the present embodiment, the direction indicated as "front" in FIG. 1 corresponds to the front of the vehicle solar panel 50, and the direction indicated as "rear" in FIG. 1 corresponds to the rear of the vehicle solar panel 50 to define the front-to-rear direction of the vehicle solar panel 50. Further, the direction indicated as "upper" in FIG. 1 corresponds to the upper part of the vehicle solar panel 50, and the direction indicated as "lower" in FIG. 1 corresponds to the lower part of the vehicle solar panel 50 to define the vertical direction, that is, the thickness-wise direction of the vehicle solar panel 50. In FIGS. 2 to 8, the front, rear, upper, and lower directional axes are indicated in correspondence with FIG. 1. These directions are merely examples for explanation and are irrelevant to the directions during use of the vehicle solar panel 50.

Figure 2:
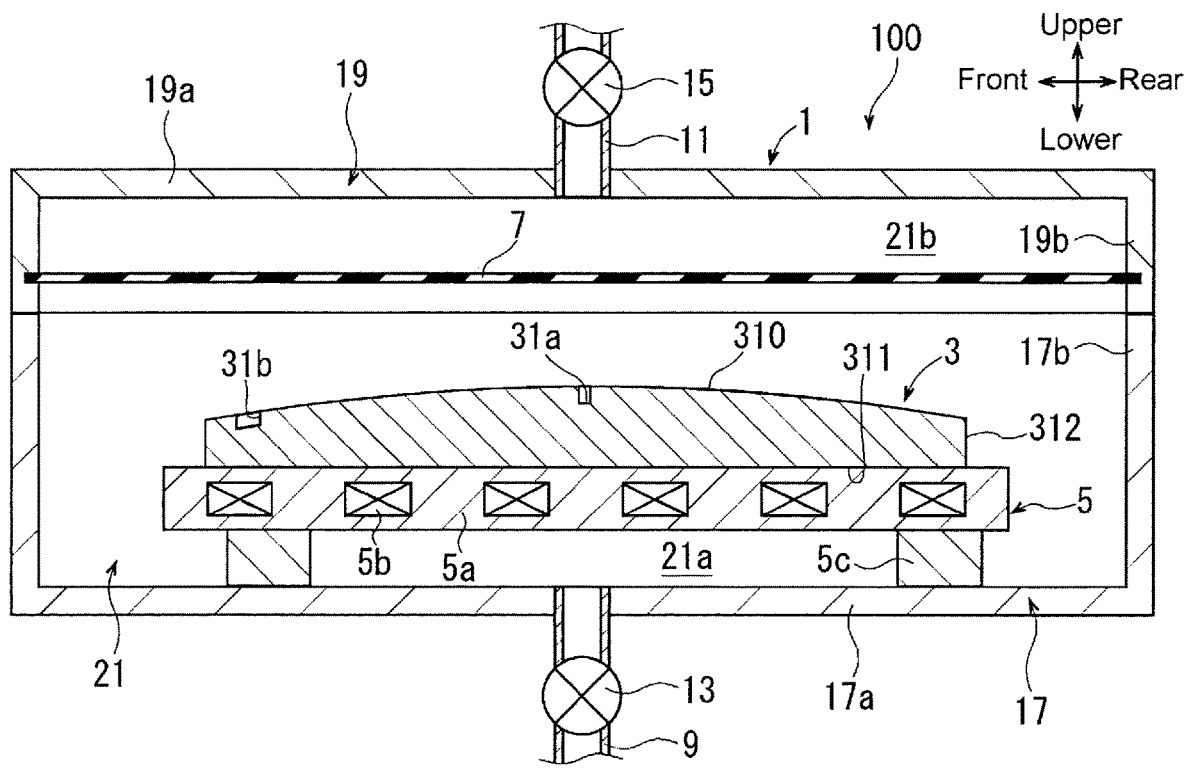
FIG. 2 is a cross-sectional view showing a laminating device in the manufacturing method according to the first embodiment.

Manufacturing the vehicle solar panel 50 involves the use of a laminating device 100 shown in FIG. 2. The laminating device 100 includes a case 1, a laminating jig 3, a heater 5, a diaphragm 7, a first pipe 9, a second pipe 11, a first pump 13, and a second pump 15.

The case 1 includes a first housing 17 and a second housing 19. The first housing 17 includes a flat bottom wall 17a and a first side wall 17b extending upward from the bottom wall 17a toward the second housing 19. The second housing 19 is coupled to the first housing 17 to be openable and closable and is located on the upper side of the first housing 17. The second housing 19 includes a flat upper wall 19a and a second side wall 19b extending downward from the upper wall 19a toward the first housing 17.

Closing the second housing 19 relative to the first housing 17 causes the first side wall 17b to abut the second side wall 19b. This defines a vacuum chamber 21 in the case 1. Although not shown in the drawings, the first side wall 17b and the second side wall 19b are provided with a seal that encapsulates a part between the vacuum chamber 21 and the outside of the case 1.

Further, the first pipe 9 is attached to the bottom wall 17a, and the second pipe 11 is attached to the upper wall 19a. In addition, the first pipe 9 is provided with the first pump 13, and the second pipe 11 is provided with the second pump 15. The first and second pumps 13 and 15 are capable of respectively discharging air out of the vacuum chamber 21 through the first and second pipes 9 and 11 and supplying air into the vacuum chamber 21.

The laminating jig 3 is located in the first housing 17, that is, in the vacuum chamber 21. The laminating jig 3 is made of metal such as aluminum and includes a supporting surface 310, a bottom surface 311, and an outer circumferential surface 312.

Figure 4:
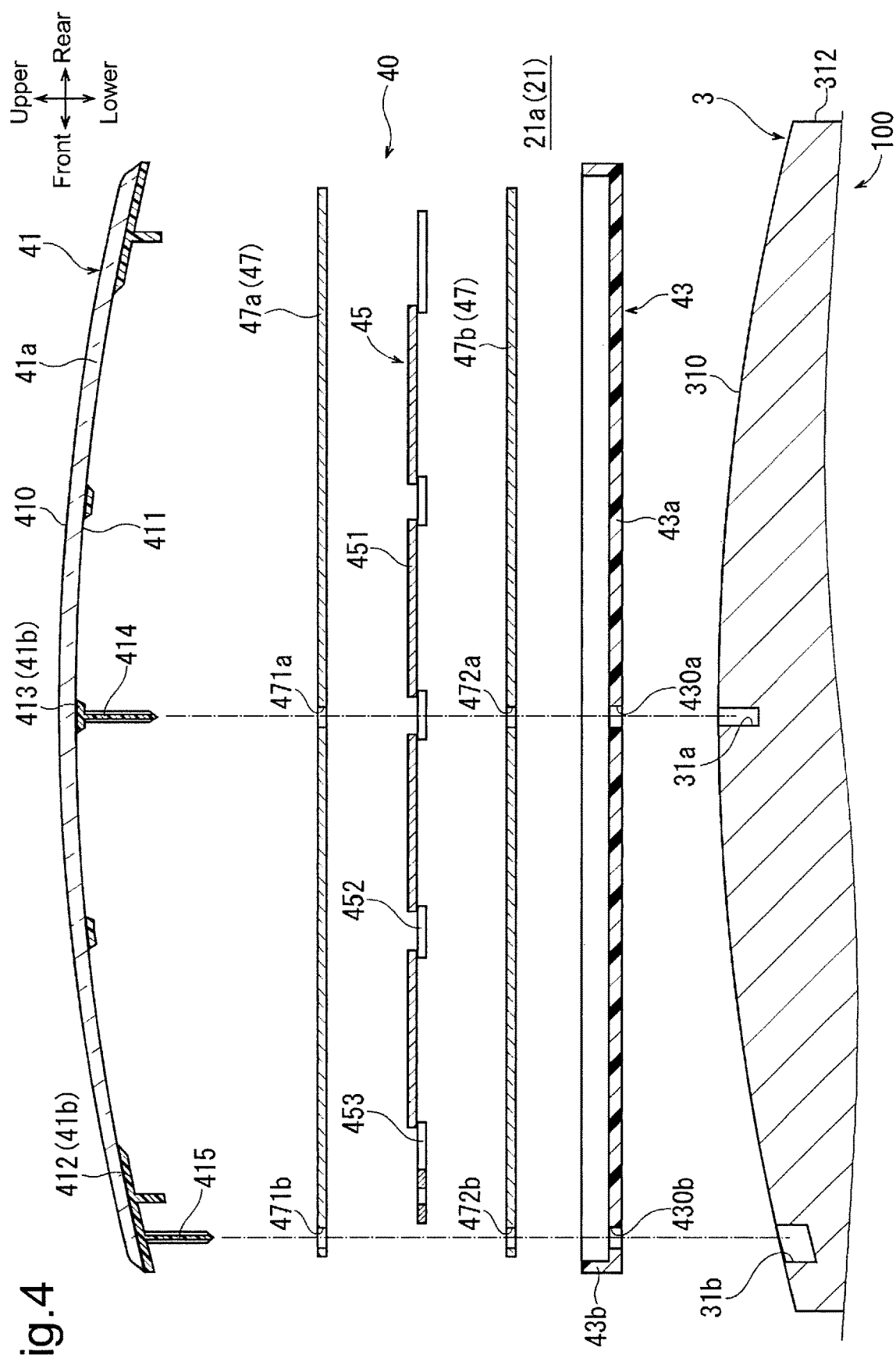
FIG. 4 is an enlarged cross-sectional view showing a laminated body and the like in the manufacturing method according to the first embodiment.

The supporting surface 310 serves as the upper surface of the laminating jig 3. As shown in FIG. 4, the supporting surface 310 is curved in a convex manner toward the upper side of the vacuum chamber 21, that is, toward a laminated body 40 (described later) at a curvature conforming to the product shape (refer to FIG. 1) of the back cover 43. Thus, the laminating jig 3 allows the back cover 43 to have the product shape, that is, to be curved in a convex manner toward the protection cover 41. Further, as shown in FIG. 4, the supporting surface 310 and thus the laminating jig 3 are larger than the protection cover 41 and the back cover 43. Additionally, the center and the front of the supporting surface 310, that is, the center and the front of the laminating jig 3 respectively have a first engagement hole 31a and a second engagement hole 31b recessed downward from the supporting surface 310. In other words, the first engagement hole 31a is located at the top of the supporting surface 310, which is the most protruding part of the supporting surface 310, and the second engagement hole 31b is located at the outer edge of the supporting surface 310. The opening of the second engagement hole 31b is larger than that of the first engagement hole 31a.

As shown in FIG. 2, the bottom surface 311 is located on the side opposite to the supporting surface 310 and has a flat shape. The outer circumferential surface 312 is continuous with the supporting surface 310 and the bottom surface 311 and extends along the outer edges of the supporting surface 310 and the bottom surface 311.

The heater 5 is provided in the vacuum chamber 21. More specifically, the heater 5 is located on the lower side of the laminating jig 3 in the first housing 17. The heater 5 includes a heater case 5a and heater main bodies 5b. The heater case 5a is made of metal such as stainless steel. The heater case 5a is larger than the laminating jig 3 and has a rectangular shape. The laminating jig 3 is mounted on the heater case 5a. This causes the bottom surface 311 of the laminating jig 3 to abut the heater case 5a. Further, the heater case 5a is fixed to the bottom wall 17a of the first housing 17 by legs 5c. The heater main bodies 5b are accommodated in the heater case 5a. Ceramic heaters, for example, can be used for the heater main bodies 5b. Each of the heater main bodies 5b generates heat when supplied with power from a power-feeding device (not shown). Thus, the heater 5 is capable of heating the laminating jig 3. The number of the heater main bodies 5b may be changed.

The diaphragm 7 is made of heat-resistant synthetic rubber resistant to the heat of the laminating jig 3 and is elastically deformable. The outer edge of the diaphragm 7 is fixed to the second side wall 19b of the second housing 19 so that the diaphragm 7 is attached to the inner side of the second housing 19. Thus, the diaphragm 7 is located above the laminating jig 3 in the vacuum chamber 21 and opposed to the laminating jig 3. Further, the diaphragm 7 divides the vacuum chamber 21 into a first vacuum region 21a, which is located on the lower side of the diaphragm 7, and a second vacuum region 21b, which is located on the upper side of the diaphragm 7.

Figure 3:
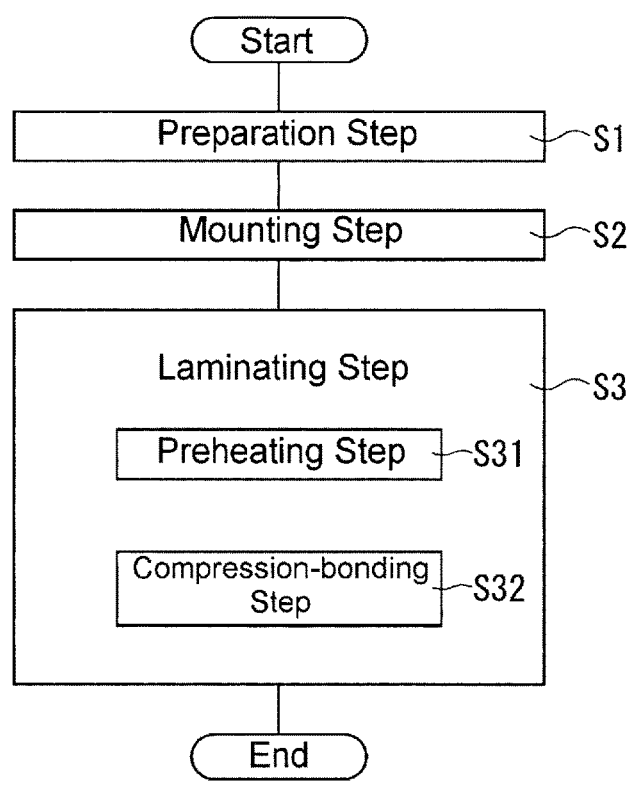
FIG. 3 is a flowchart illustrating the manufacturing method according to the first embodiment.

The vehicle solar panel 50 shown in FIG. 1 is manufactured through the manufacturing method according to the first embodiment. As shown in FIG. 3, the manufacturing method includes a preparation step S1, a mounting step S2, and a laminating step S3.

In the manufacturing method, the preparation step S1 is performed first. In the preparation step S1, as shown in FIG. 4, the laminated body 40 including the protection cover 41, the back cover 43, the photovoltaic string 45, and the encapsulant 47 is prepared.

The protection cover 41 includes a cover body 41a and a shield 41b. The cover body 41a has a rectangular shape, is made of a light-transmissive plastic of which the main component is polycarbonate, and is therefore light-transmissive from a front surface 410 to a rear surface 411. As shown in FIG. 1, the front surface 410 serves as the front surface of the vehicle solar panel 50, that is, the design surface of the vehicle solar panel 50. As shown in FIG. 4, the cover body 41a and thus the protection cover 41 are curved in a convex manner from the rear surface 411 toward the front surface 410 in advance at a curvature conforming to the roof panel of the vehicle. The shield 41b is made of a plastic of which the main component is opaque (for example, black) polycarbonate. The shield 41b is formed by being injection-molded to the rear surface 411 of the cover body 41a and integrated with the rear surface 411. The cover body 41a and the shield 41b may be made of a plastic of which the main component is not polycarbonate. Further, the protection cover 41 may only include the cover body 41a.

The shield 41b includes a peripheral portion 412 and coupling portions 413. The peripheral portion 412 surrounds the photovoltaic string 45 along the outer edge of the cover body 41a. The peripheral portion 412 prevents connection tab wires 453 and the like of the photovoltaic string 45 from being seen from the front surface 410 of the cover body 41a. The coupling portions 413 are arranged on the inner side of the peripheral portion 412 and extend in the width direction of the cover body 41a. The coupling portions 413 prevent interconnectors 452 of the photovoltaic string 45 from being seen from the front surface 410.

One of the coupling portions 413 that is located at the center of the protection cover 41 is provided integrally with a first engagement projection 414. The first engagement projection 414 is located at the center of the protection cover 41 and thus at the center of the laminated body 40. The first engagement projection 414 extends straight downward from the coupling portion 413. At the peripheral portion 412, the front part of the protection cover 41 is integrally provided with a second engagement projection 415. The second engagement projection 415 has the same structure as the first engagement projection 414.

The back cover 43 is made of a plastic of which the main component is polycarbonate. The back cover 43 has substantially the same size as the protection cover 41. The back cover 43 includes a flat bottom plate 43a and a peripheral wall 43b extending upward from the bottom plate 43a while surrounding the bottom plate 43a. The bottom plate 43a has a through-hole 430a through which the first engagement projection 414 is inserted and a through-hole 430b through which the second engagement projection 415 is inserted. The back cover 43 may be made of a plastic of which the main component is not polycarbonate. The back cover 43 may only include the bottom plate 43a.

The photovoltaic string 45 includes photovoltaic battery cells 451, the interconnectors 452, and the connection tab wires 453. The photovoltaic battery cells 451 are arranged in a matrix manner. The photovoltaic battery cells 451 are electrically connected by the interconnectors 452 and the connection tab wires 453.

The encapsulant 47 includes a first encapsulating member 47a and a second encapsulating member 47b. The first and second encapsulating members 47a, 47b are made of ethylene-vinyl acetate (EVA) and have a sheet shape. In addition, the first encapsulating member 47a has a through-hole 471a through which the first engagement projection 414 is inserted and a through-hole 471b through which the second engagement projection 415 is inserted. The second encapsulating member 47b has a through-hole 472a through which the first engagement projection 414 is inserted and a through-hole 472b through which the second engagement projection 415 is inserted. Instead of EVA, the first and second encapsulating members 47a, 47b may be made of, for example, ionomer plastic, silicone plastic, or polyolefin. To facilitate understanding, FIG. 4 and the like illustrate the thicknesses and sizes of the first and second encapsulating members 47a, 47b, the photovoltaic battery cells 451, and the like in an exaggerated manner and illustrate the shapes of the first and second engagement projections 414, 415 and the like in an exaggerated manner.

In the laminated body 40, the protection cover 41, the first encapsulating member 47a, the photovoltaic string 45, the second encapsulating member 47b, and the back cover 43 are laminated in this order. Thus, the back cover 43 is arranged to face the rear surface 411 of the cover body 41a. In the laminated body 40, the protection cover 41 and the back cover 43 are temporarily held by using, for example, a double-sided tape with the first encapsulating member 47a, the photovoltaic string 45, and the second encapsulating member 47b arranged between the protection cover 41 and the back cover 43. This causes the first and second engagement projections 414, 415 to respectively extend through the through-hole 430a, 430b and protrude downward from the back cover 43.

Figure 7:
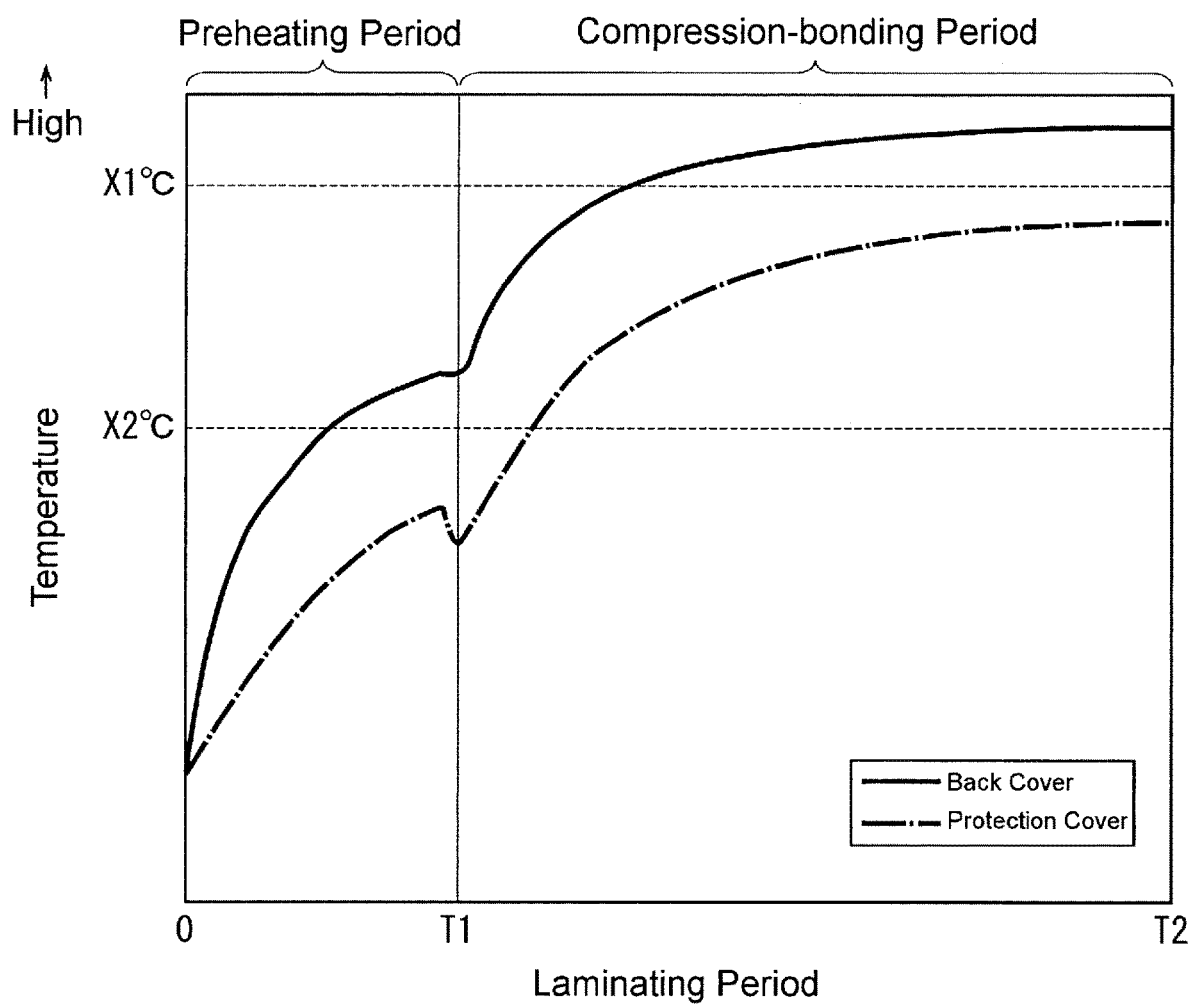
FIG. 7 is a graph illustrating changes in temperature of a protection cover and a back cover in the manufacturing method according to the first embodiment.

The preparation step S1 involves the preparation of the laminating device 100, which is shown in FIG. 2. The heater main bodies 5b are supplied with power to be heated. In this manner, the heater 5 is used to heat the laminating jig 3 to a glass transition temperature $X2°$ C. of the first and second encapsulating members 47a, 47b or higher. In the laminated body 40, whereas the protection cover 41 and the back cover 43 are made of a plastic of which the main component is polycarbonate, the first and second encapsulating members 47a, 47b are made of EVA. Thus, as shown in FIG. 7, the glass transition temperature $X2°$ C. of the first and second encapsulating members 47a, 47b is lower than a glass transition temperature $X1°$ C. of the protection cover 41 and the back cover 43. As described below, in the laminated body 40, the protection cover 41 is located farther from the laminating jig 3 than the back cover 43. Thus, even if the heat of the laminating jig 3 heats the laminated body 40, the temperatures of the protection cover 41 and the back cover 43 never become the glass transition temperature $X1°$ C. at the same time. Accordingly, the heater 5 heats the laminating jig 3 in a temperature range in which the back cover 43 can be heated by the heat of the laminating jig 3 to the glass transition temperature $X1°$ C. or higher whereas the temperature of the protection cover 41 can be set to be lower than the glass transition temperature $X1°$ C.

Figure 5:
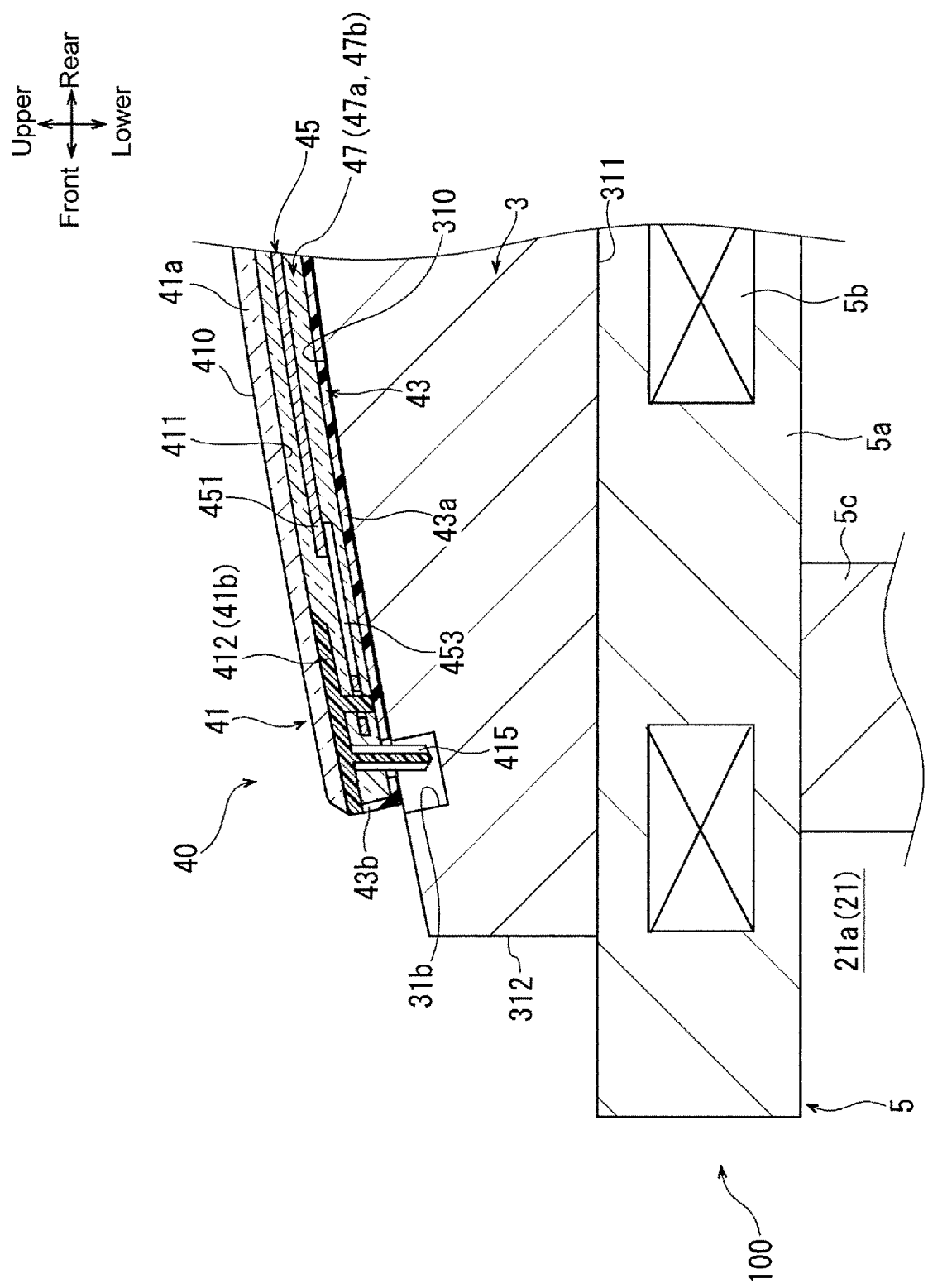
FIG. 5 is a partially cross-sectional view showing a state in which a laminating jig of FIG. 2 supports a laminated body of FIG. 4 in the manufacturing method according to the first embodiment.

Subsequently, the mounting step S2 shown in FIG. 3 is performed. In the mounting step S2, as shown in FIGS. 4 and 5, the laminated body 40 is mounted on the laminating jig 3. In the laminated body 40, the back cover 43 faces the laminating jig 3. As shown in FIG. 4, the first engagement projection 414 is inserted through the first engagement hole 31a, and the second engagement projection 415 is inserted through the second engagement hole 31b. Thus, the laminated body 40 is positioned relative to the laminating jig 3. This causes the bottom plate 43a of the back cover 43 to abut the laminating jig 3 so that the laminating jig 3 supports the laminated body 40 to contact the back cover 43. With the laminated body 40 mounted on the laminating jig 3, the first encapsulating member 47a, the photovoltaic string 45, the second encapsulating member 47b, and the back cover 43 are arranged between the protection cover 41 and the laminating jig 3. That is, the protection cover 41 is located farther from the laminating jig 3 than the back cover 43.

Then, the laminating step S3 shown in FIG. 3 is performed. The laminating step S3 includes a preheating step S31 and a compression-bonding step S32. In the preheating step S31, the laminated body 40 is heated for a certain period of time with the laminating jig 3 supporting the laminated body 40. This starts to gradually soften the back cover 43 and starts to deform the flat bottom plate 43a so as to conform to the shape of the supporting surface 310 (refer to FIG. 5). This also starts to gradually soften the first encapsulating member 47a and the second encapsulating member 47b. Since the laminating jig 3 is larger than the protection cover 41 and the back cover 43, even if the protection cover 41 and the back cover 43 thermally expand, the supporting surface 310 is capable of supporting the laminated body 40. Further, since the opening of the second engagement hole 31b is large, thermal expansion of the protection cover 41 allows for movement of the second engagement projection 415 in the second engagement hole 31b. Thus, after a certain period of time has elapsed, the preheating step S31 is completed.

Figure 6:
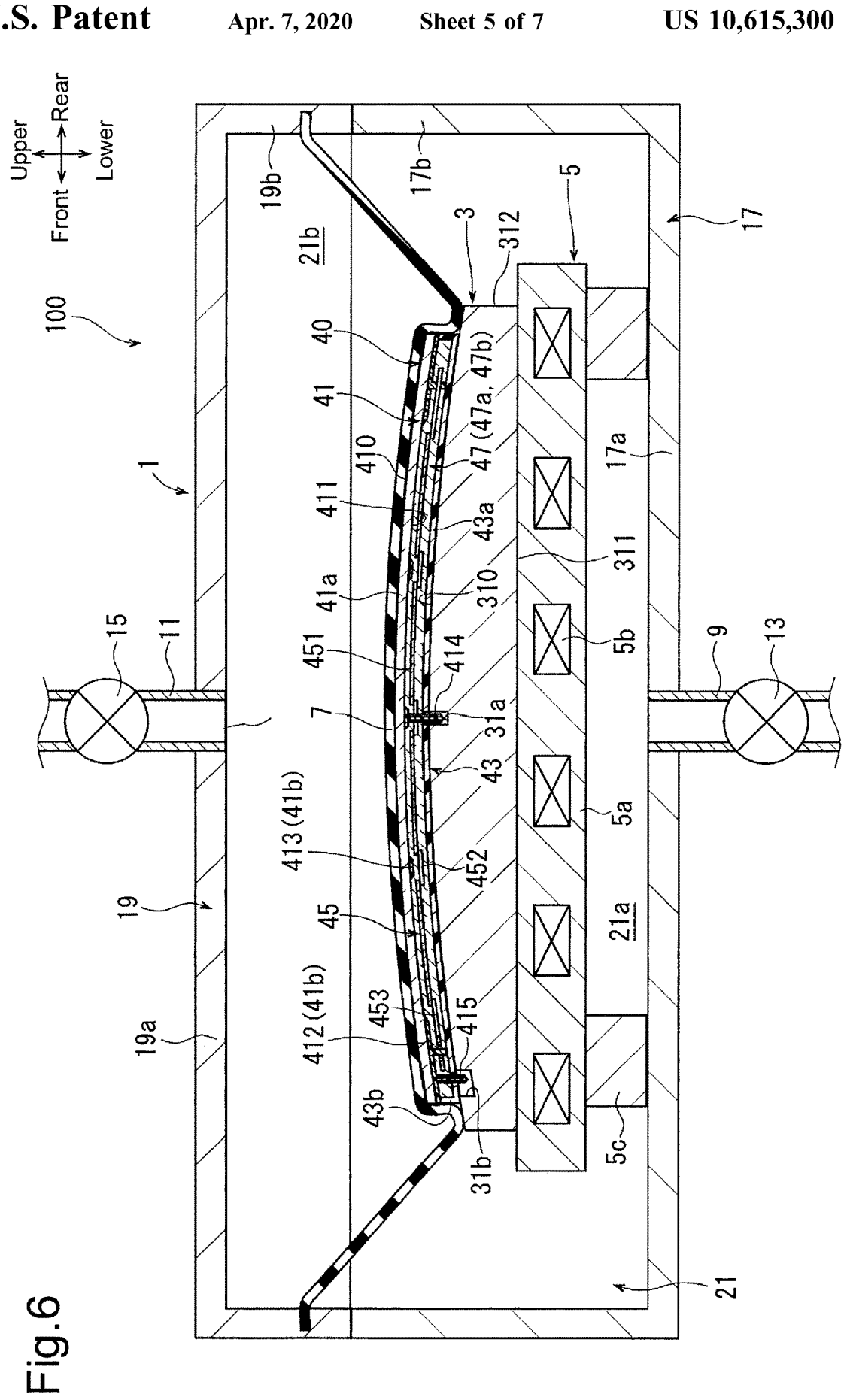
FIG. 6 is an enlarged cross-sectional view showing a state in which a diaphragm and the laminating jig are used to compression-bond the laminated body of FIG. 4 in a laminating step in the manufacturing method according to the first embodiment.

After completion of the preheating step S31, the compression-bonding step S32 is performed. In the compression-bonding step S32, while the heat of the laminating jig 3 continues to heat the laminated body 40, the first and second pumps 13, 15 are activated so that a vacuum state is produced in the vacuum chamber 21, that is, the first and second vacuum regions 21a, 21b as shown in FIG. 6. This discharges air out of the laminated body 40. Thereafter, the second pump 15 is used to supply the second vacuum region 21b with air so that the second vacuum region 21b has a higher pressure than the first vacuum region 21a. This presses the diaphragm 7 on the protection cover 41 of the laminated body 40 while elastically deforming the diaphragm 7. The laminating jig 3 continues to support the laminated body 40 from a side where the back cover 43 is provided, that is, from the side opposite to the diaphragm 7. In this manner, the diaphragm 7 compression-bonds the laminated body 40 while holding the laminated body 40 with the laminating jig 3.

Since the laminated body 40 continues to be heated by the heat of the laminating jig 3, the temperature of the back cover 43 reaches or exceeds the glass transition temperature X1° C. in the laminated body 40. This sufficiently softens the back cover 43. Thus, compression-bonding the laminated body 40 curves and projects the back cover 43 toward the protection cover 41 along the supporting surface 310 such that the back cover 43 has a product shape. This also integrates the first encapsulating member 47a and the second encapsulating member 47b, which have been softened. Accordingly, the encapsulant 47 holds the photovoltaic string 45, that is, the photovoltaic battery cells 451, the interconnectors 452, and the connection tab wires 453 in an encapsulated state between the protection cover 41 and the back cover 43. This integrates the protection cover 41, the back cover 43, the photovoltaic string 45, and the encapsulant 47. Thus, after completion of the compression-bonding step S32 and the laminating step S3, the vehicle solar panel 50 is obtained from the laminated body 40, which is shown in FIG. 1. In the vehicle solar panel 50, portions of the first and second engagement projections 414, 415 protruding from the back cover 43 are cut off.

Thus, with this manufacturing method, in the laminated body 40 prepared through the preparation step S1, the protection cover 41 is curved in a convex manner from the rear surface 411 toward the front surface 410. Accordingly, the laminating step S3 dispenses with curving of the protection cover 41. That is, with this manufacturing method, the protection cover 41 does not need to be heated and softened. In addition, with this manufacturing method, the mounting step S2 causes the back cover 43 to abut the laminating jig 3 so that the laminated body 40 is mounted on the laminating jig 3. This moves the protection cover 41 away from the laminating jig 3. Thus, this manufacturing method prevents the protection cover 41 from being heated unnecessarily even if the laminated body 40 is heated by using the laminating jig 3 until the temperature of the back cover 43 reaches or exceeds the glass transition temperature X1° C. As a result, the temperature of the protection cover 41 never reaches the glass transition temperature X1° C. This will now be described more specifically with reference to FIG. 7. In the graph, the laminating period is when the laminating step S3 is performed. From the beginning of the laminating step S3 to time T1, namely, a preheating period, the preheating step S31 is performed. From time T1 to time T2, namely, a compression-bonding period, the compression-bonding step S32 is performed.

With the manufacturing method, heating is performed in the temperature range in which the back cover 43 can be heated by the heat of the laminating jig 3 to the glass transition temperature X1° C. or higher whereas the temperature of the protection cover 41 can be set to be lower than the glass transition temperature X1° C. Thus, as the preheating period elapses, the laminated body 40 is heated by the laminating jig 3 such that the protection cover 41 and the back cover 43 rise in temperature. Since the protection cover 41 is located farther from the laminating jig 3 than the back cover 43, the temperature rise of the protection cover 41 is limited as compared to the back cover 43. Thereafter, at time t1, the preheating step S31 ends and the compression-bonding step S32 is started at the same time. As a result, a vacuum state is produced in the vacuum chamber 21 such that the diaphragm 7 abuts the laminated body 40. This slightly decreases the temperatures of the protection cover 41 and the back cover 43 and thus the temperature of the laminated body 40.

While the compression-bonding step S32 is performed, the heat of the laminating jig 3 continues to heat the laminated body 40 so that the temperature of the back cover 43 exceeds the glass transition temperature X1° C. In contrast, the temperature of the protection cover 41 remains lower than the glass transition temperature X1° C. over the whole period of the laminating step S3. Accordingly, with this manufacturing method, although the front surface 410 of the cover body 41a abuts the diaphragm 7 in the protection cover 41, compression-bonding the laminated body 40 highly ensures that roughening of the front surface 410 is prevented. This manufacturing method also prevents the shield 41*b* of the protection cover 41 from being roughened.

Additionally, this manufacturing method allows the back cover 43 to be heated to the glass transition temperature X1° C. or higher and therefore be curved by the laminating jig 3 in a preferred manner to have the product shape in the compression-bonding step S32. Accordingly, this manufacturing method limits creasing of the back cover 43 and trapping of air between the back cover 43 and the encapsulant 47.

Thus, the method for manufacturing the solar panel according to the first embodiment allows for manufacturing of the high-quality vehicle solar panel 50 provided with the protection cover 41 and the back cover 43 that are made of plastic.

Second Embodiment

Figure 8:
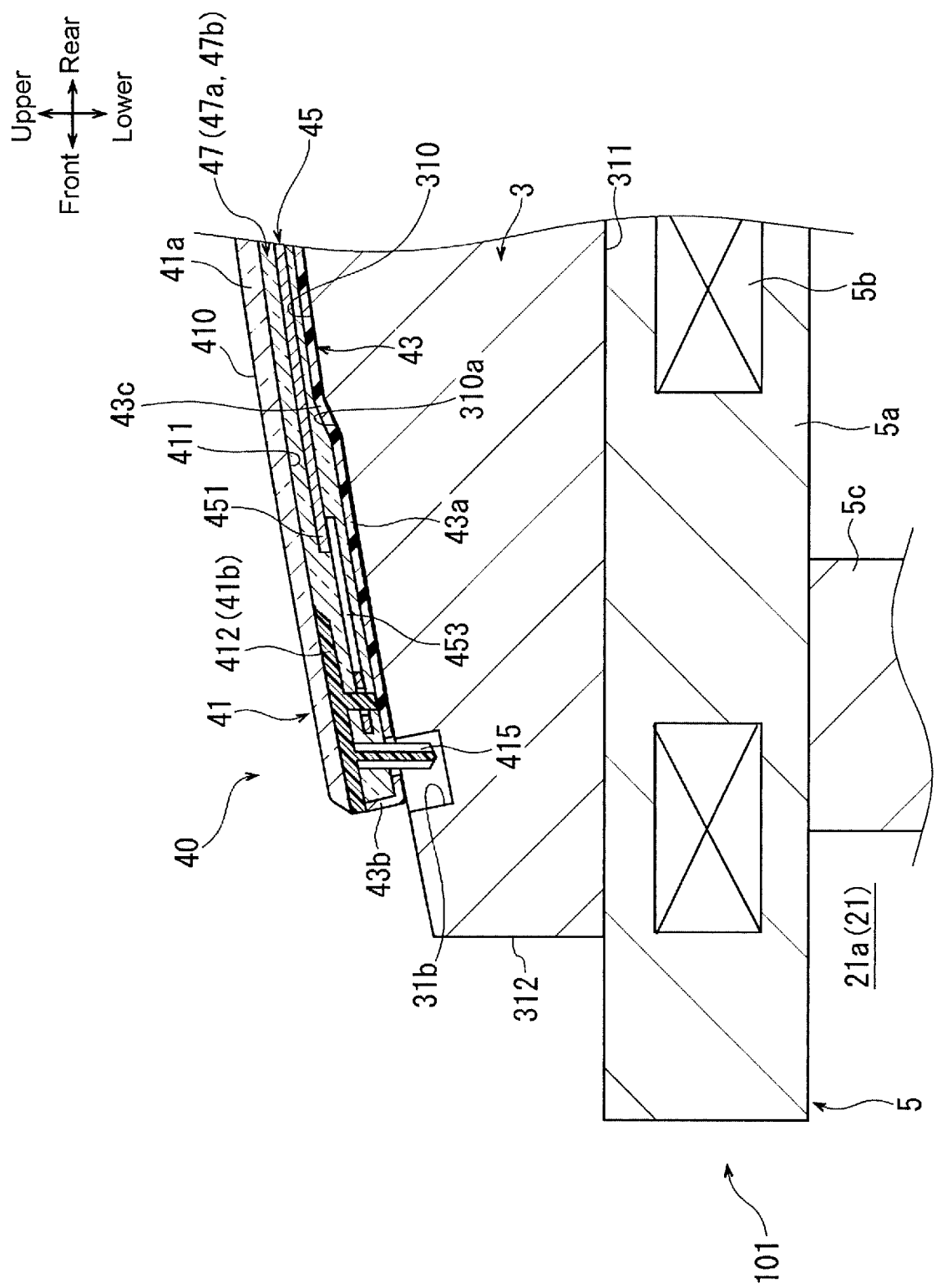
FIG. 8 is a partially cross-sectional view showing a state in which the laminating jig supports the laminated body in a manufacturing method according to a second embodiment.

With a manufacturing method according to a second embodiment, a laminating device 101 shown in FIG. 8 is prepared in the preparation step S1. In the laminating device 101, a stepped part 310*a* protrudes from the supporting surface 310 of the laminating jig 3 toward the laminated body 40. The shape of the stepped part 310*a* may be changed. The remaining structures of the manufacturing method according to the second embodiment are the same as those of the manufacturing method according to the first embodiment including the remaining structures of the laminating device 101.

With this manufacturing method, the compression-bonding step S32 is performed to curve and project the back cover 43 toward the protection cover 41, and the shape of the stepped part 310*a* allows the bottom plate 43*a* of the back cover 43 to be provided with a step 43*c*. That is, with this manufacturing method, the back cover 43 has a product shape so as to include the step 43*c* while being curved in a convex manner toward the protection cover 41. Accordingly, the thickness of the vehicle solar panel 50 obtained through this manufacturing method changes at the step 43*c*. The remaining operations of the manufacturing method according to the second embodiment are the same as those of the manufacturing method according to the first embodiment.

The present invention has been described in accordance with the first embodiment and the second embodiment. However, it should be apparent to those skilled in the art that the present invention may be embodied in many other specific forms without departing from the spirit or scope of the invention. Particularly, it should be understood that the present invention may be embodied in the following forms.

For example, the supporting surface 310 may have a predetermined pattern so that the pattern of the supporting surface 310 is transferred to the bottom plate 43*a* of the back cover 43 in the compression-bonding step S32.

The present invention is applicable to manufacturing of solar panels or the like used for various types of photovoltaic facilities in addition to vehicle solar panels.

The invention claimed is:

1. A method for manufacturing a solar panel, the method comprising:
    preparing a laminated body including
        a plastic protection cover that is light-transmissive from a front surface to a rear surface and is curved in a convex manner from the rear surface toward the front surface,
        a flat plastic back cover arranged to face the rear surface of the protection cover,
        a photovoltaic battery cell, and
        an encapsulant that holds the photovoltaic battery cell in an encapsulated state between the protection cover and the back cover;
    mounting the laminated body on a laminating jig such that the back cover abuts the laminating jig; and
    heating the laminated body with the laminating jig until a temperature of the back cover reaches or exceeds a glass transition temperature and compression-bonding the laminated body by holding the laminated body between a diaphragm and the laminating jig, thereby obtaining a solar panel from the laminated body,
    wherein the laminating jig is curved in a convex manner toward the laminated body.

2. The method according to claim 1, wherein the compression-bonding the laminated body includes heating the laminated body such that the temperature of the protection cover is lower than the glass transition temperature.

3. The method according to claim 1, wherein the mounting the laminated body on the laminating jig includes mounting the laminated body on a supporting surface of the laminating jig, which is curved in a convex manner.

4. The method according to claim 3, wherein the mounting the laminated body on the laminating jig includes positioning the laminated body relative to the supporting surface by inserting one or more engagement projections extending from the protection cover into one or more engagement holes on the supporting surface.

* * * * *